US006852602B2

(12) United States Patent
Kanzawa et al.

(10) Patent No.: US 6,852,602 B2
(45) Date of Patent: Feb. 8, 2005

(54) SEMICONDUCTOR CRYSTAL FILM AND METHOD FOR PREPARATION THEREOF

(75) Inventors: Yoshihiko Kanzawa, Kadoma (JP); Tohru Saitoh, Settsu (JP); Katsuya Nozawa, Osaka (JP); Minoru Kubo, Nabari (JP); Yoshihiro Hara, Hirakata (JP); Takeshi Takagi, Kyoto (JP); Takahiro Kawashima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 56 days.

(21) Appl. No.: 10/298,000

(22) PCT Filed: Jan. 30, 2002

(86) PCT No.: PCT/JP02/00737

§ 371 (c)(1),
(2), (4) Date: Dec. 12, 2002

(87) PCT Pub. No.: WO02/061842

PCT Pub. Date: Aug. 8, 2002

(65) Prior Publication Data

US 2004/0092085 A1 May 13, 2004

(30) Foreign Application Priority Data

Jan. 31, 2001 (JP) ........................................ 2001-022962

(51) Int. Cl.$^7$ ............................................. H01L 21/331

(52) U.S. Cl. ........................ 438/312; 438/47; 438/94; 438/172; 438/191; 257/11; 257/15; 257/18; 257/19; 257/63

(58) Field of Search ............................. 257/15, 18, 19, 257/55, 63, 77, 78, 189, 200, 616, 631, 11; 438/47, 94, 172, 191, 235, 311, 312, 341, 481, 602–604, 607, 752, 933

(56) References Cited

U.S. PATENT DOCUMENTS

| 5,523,592 | A  | * | 6/1996  | Nakagawa et al. | ............ | 257/96  |
| 6,403,975 | B1 | * | 6/2002  | Brunner et al.  | ................ | 257/15  |
| 6,403,976 | B1 | * | 6/2002  | Saitoh et al.   | .................. | 257/19  |
| 6,459,107 | B2 | * | 10/2002 | Sugiyama et al. | .......... | 257/226 |
| 6,475,857 | B1 | * | 11/2002 | Kim et al.      | .................. | 438/240 |

(List continued on next page.)

FOREIGN PATENT DOCUMENTS

| EP | 020898 A2   | 7/2000  |
| JP | 5-102177 A  | 4/1993  |
| JP | 06-224127   | 8/1994  |
| JP | 7-022330 A  | 1/1995  |
| JP | 09-283533   | 10/1997 |
| JP | 11-312686   | 11/1999 |
| KR | 2000-027652 | 5/2000  |

OTHER PUBLICATIONS

"The influence of substitutional carbon on the Si/Ge interdiffusion studied by x–ray diffractometry at superlattice structures" P. Zaumseil, Journal of Physics D Applied Physics, May 1999, vol. 32, No. 10A, pp. A75 to A80.

(List continued on next page.)

Primary Examiner—John F. Niebling
Assistant Examiner—Stanetta Isaac
(74) Attorney, Agent, or Firm—McDermott Will & Emery LLP

(57) ABSTRACT

A multi-layer film 10 is formed by stacking a $Si_{1-x1-y1}Ge_{x1}C_{y1}$ layer ($0 \leq x1 < 1$ and $0 < y1 < 1$) having a small Ge mole fraction, e.g., a $Si_{0.785}Ge_{0.2}C_{0.015}$ layer 13, and a $Si_{1-x2-y2}Ge_{x2}C_{y2}$ layer ($0 < x2 \leq 1$ and $0 \leq y2 < 1$) (where x1<x2 and y1>y2) having a high Ge mole fraction, e.g., a $Si_{0.2}Ge_{0.8}$ layer 12. In this manner, the range in which the multi-layer film serves as a SiGeC layer with C atoms incorporated into lattice sites extends to high degrees in which a Ge mole fraction is high.

23 Claims, 9 Drawing Sheets

U.S. PATENT DOCUMENTS

| | | | |
|---|---|---|---|
| 6,509,586 B2 * | 1/2003 | Awano | 257/192 |
| 6,537,369 B1 * | 3/2003 | Saitoh et al. | 117/3 |
| 6,617,653 B1 * | 9/2003 | Yokogawa et al. | 257/379 |
| 6,660,393 B2 * | 12/2003 | Saitoh et al. | 428/446 |
| 6,667,489 B2 * | 12/2003 | Suzumura et al. | 257/12 |
| 6,678,296 B1 * | 1/2004 | Ohfuti | 372/43 |
| 6,690,035 B1 * | 2/2004 | Yokogawa et al. | 257/77 |
| 2003/0006415 A1 * | 1/2003 | Yokogawa et al. | 257/77 |

OTHER PUBLICATIONS

"Materials characterization of $Si_{1-x-y}Ge_xC_y$/Si superlattice structures" T. Laursen et al., Thin Solid Films, Oct. 1997, vols. 308 to 309, pp. 358 to 362.

"Silicon–Germanium–Carbon Alloys Extending Si Based Heterostructure Engineering" A. Powell et al., Jpn. J. Appl. Phys. vol. 33 (1994) pp. 2388–2391, Part 1, No. 4B, Apr. 1994.

"SiGeC: Band gaps, band offsets, optical properties, and potential applications", K. Brunner et al., J. Vac. Sci. Technol. B 16(3), May/Jun. 1998, pp. 1701–1706.

"Dependence of substitutional C incorporation on Ge content for $Si_{1-x-y}Ge_xC_y$ crystals grown by ultrahigh vacuum chemical vapor deposition", Y. Kanzawa et al., Applied Physics Letters, vol. 77, No. 24, Dec. 11, 2000, pp. 3962–3964.

* cited by examiner p-MOSFET / gate insulating film p-channel

SEMICONDUCTOR CRYSTAL FILM AND METHOD FOR PREPARATION THEREOF

TECHNICAL FIELD

The present invention relates to semiconductor crystal films that contain Si, C and Ge and have high crystallinity, to methods for producing the films, to semiconductor devices including the semiconductor crystal films, and to methods for fabricating the devices.

BACKGROUND ART

Recently, semiconductor devices using Si crystals have attained improved multifunctionality and high-speed capability in turns. This attainment is largely attributable to scaling-down of transistors and other semiconductor elements. To continue to improve semiconductor-device performance in the future, further scaling-down of semiconductor elements is necessary. In order to pursue further performance-improvements, however, there exist many problems to be technically overcome other than semiconductor device scaling-down.

For example, even if the semiconductor elements have been further downsized, the optimal performance of the resultant semiconductor devices is restricted by the physical properties (e.g., mobility) of the base material, i.e., Si. In other words, as long as a Si crystal is employed as the material, dramatical improvement in device performance will be problematic.

Therefore, semiconductor devices using mixed-crystal semiconductors of Group IV elements have attracted attention these days as semiconductor devices operatable at high speeds. In particular, carbon C-containing crystals of $Si_{1-x-y}Ge_xC_y$ (where $0<x<1$ and $0<y<1$), which are Group IV elements (hereinafter also referred to as SiGeC) have been intensely researched recently. The $Si_{1-x-y}Ge_xC_y$ crystals may be regarded as an improvement on $Si_{1-x}Ge_x$ crystals (where $0<x<1$) which recently have been made practicable as a semiconductor device material (hereinafter also referred to as SiGe). The $Si_{1-x-y}Ge_xC_y$ crystals are understood to have the following superior properties.

A $Si_{1-x}Ge_x$ crystal that has been put into practical use is a material having a lattice constant larger than that of Si crystal. Accordingly, if a heterojunction is formed by superposing a $Si_{1-x}Ge_x$ crystal layer on a Si layer, a great compressive strain is created in the $Si_{1-x}Ge_x$ crystal layer. When the thickness of the $Si_{1-x}Ge_x$ crystal layer exceeds the thickness limit, which is called the critical thickness (i.e., the upper-limit thickness where the film can be deposited without dislocation), this compressive strain gives rise to a phenomenon in which even while dislocation is generated in the $Si_{1-x}Ge_x$ crystal layer, and thus stress therein is relaxed. Moreover, near the critical thickness, even though the film thickness does not exceed the critical thickness, relaxation of stress attendant on dislocation can occur when the film is subjected to heating. Turning also to the band structure at the heterojunction where the Si and $Si_{1-x}Ge_x$ crystal layers are stacked: a band offset (a heterobarrier) is formed only in the valence band edge of the $Si_{1-x}Ge_x$ crystal layer. This means that in fabricating high-speed MIS transistors with $Si_{1-x}Ge_x$ crystal layers for the channels, only p-channel MIS transistors can be manufactured.

However, if C is added to the $Si_{1-x}Ge_x$ crystal, because C is an element having an atomic radius smaller than that of Si or Ge, the lattice constant of this crystal decreases, thus reducing strain. The lattice structure of $Si_{1-x-y}Ge_xC_y$ in which C is added in an amount of about one-eighth of the Ge mole fraction almost lattice matches with that of the Si crystal. In addition, since strain accumulated in the $Si_{1-x}Ge_x$ crystal can be reduced, thermal stability is also enhanced. It has been reported (in K. Brunner et al., J. Vac. Sci. Technol. B16, 1701 (1998)) that in a heterojunction structure in which $Si_{1-x-y}Ge_xC_y$ and Si crystal layers are stacked with composition in which the mole fractions of Ge and C are high (the Ge mole fraction is several tens atomic percent and the C mole fraction is above several tens atomic percent), band offset is formed in each of the valence and conduction band edges of the $Si_{1-x-y}Ge_xC_y$ crystal. In this case, carriers are confined within either the valence and conduction band edges, thus enabling manufacturing of not only p-channel transistors but also n-channel transistors. In addition, C is known to have a diffusion-suppressing effect on boron (B). This property of C operates very effective in fabricating semiconductor devices that require appropriate control over boron profile and is also useful in stabilizing the semiconductor-device manufacturing. For example, the use of a semiconductor layer containing C in a region to be doped with boron in fabricating an ultrahigh-speed npn bipolar transistor with a narrow (i.e., thin-layer) base region or for fabricating a field-effect transistor with a δ-doped layer prevents the heating treatment from causing the boron to diffuse, thereby ensuring fabrication of a device that has a doping profile as designed.

Problems to be Solved

As described above, the C-containing Group-IV crystal of $Si_{1-x-y}Ge_xC_y$ is a material having properties superior to Si or $Si_{1-x}Ge_x$. However, because of the unique properties of C to be described below, it is more difficult to produce a high-quality $Si_{1-x-y}Ge_xC_y$ crystal than to produce a $Si_{1-x}Ge_x$ crystal. First, the solid solubility of C atoms in Si or Ge is fairly small (about $10^{17}$ atm. cm$^{-3}$ in Si crystal and about $10^8$ atm. cm$^{-3}$ in Ge crystal, in a thermal equilibrium condition). Thus, producing a $Si_{1-x-y}Ge_xC_y$ crystal containing C at a high mole fraction (atm. percent order) becomes difficult under a thermal equilibrium condition during, for example, a fusion process. Next, C atoms have a property of being easily incorporated into the lattice at an interstitial site as well as a substitutional site of the crystal, and thus the C atoms are likely to make the crystallinity worse. Further, C tends to selectively bond with Si, so that the $Si_{1-x-y}Ge_xC_y$ crystal is likely to have a structure similar to that of a crystalline silicon carbide or an amorphous silicon carbide is likely to be created in. As a result, this local structure is apt to degrade the crystallinity of the $Si_{1-x-y}Ge_xC_y$ crystal.

To prevent this degradation, $Si_{1-x-y}Ge_xC_y$ crystals have been conventionally produced using techniques such as Molecular Beam Epitaxy (MBE) and Chemical Vapor Deposition (CVD) methods. Recently, the CVD method has been mainly used because the MBE method is inadequate for mass production.

In the CVD method, while a Si substrate is heated in a vacuum vessel, a source gas is introduced into the vessel to be decomposed by the heat, thereby allowing crystal growth on the substrate. A $Si_{1-x-y}Ge_xC_y$ crystal is produced by supplying: a silane gas (which is generally a single gas) containing, for example, monosilane ($SiH_4$) or disilane ($Si_2H_6$) as a Si material; germane ($GeH_4$) as a Ge material; and a gas (which is generally a single gas) containing C such as monometylsilane ($SiH_3CH_3$) or acetylene ($C_2H_2$) as a C material, to the vacuum vessel at the same time. Even when this process is used, however, C is not always incorporated into lattice sites of the $Si_{1-x-y}Ge_xC_y$ crystal at any mole fraction of C. In other words, the C mole fraction at which C is incorporated into the lattice sites has a threshold value. When the C mole fraction exceeds this threshold value so that C is mixed into the $Si_{1-x-y}Ge_xC_y$ crystal, the crystallinity of the $Si_{1-x-y}Ge_xC_y$ crystal decreases greatly. Under present circumstances, especially a defect-free $Si_{1-x-y}Ge_xC_y$ crystal with high crystallinity applicable to semiconductor devices can be attained only when the C mole fraction is about 2 atm. % or smaller.

The present inventors have researched to ascertain the maximum value of C mole fraction, to fined the following fact at present.

The research of the present inventors shows that the maximum value of the C mole fraction at which C atoms are incorporated into lattice sites in a $Si_{1-x-y}Ge_xC_y$ crystal changes depending on the Ge mole fraction (in Kanzawa et al., Appl. Phys. Lett. 77, 3962 (2000)).

FIG. 1 shows how the maximum value (the upper limit) of a C mole fraction at which C is incorporated into lattice sites in a single-layer SiGeC crystal depends on a Ge mole fraction. In FIG. 1, the abscissa represents the Ge mole fraction in the SiGeC crystal, while the ordinate represents the maximum value (the upper limit) of the C mole fraction at which C is incorporated into the crystal lattice sites. The data shows the results obtained by depositing a single-layer SiGeC crystal on a Si substrate by an Ultra-High Vacuum/Chemical Vapor Deposition (UHV-CVD) process. For source gases, $Si_2H_6$, $GeH_4$ and $SiH_3CH_3$ are used. The substrate temperature during the deposition is 490° C. As shown in FIG. 1, C is incorporated into lattice sites to an extent of about 1.9 atm. % if the crystal has a Ge mole fraction of about 13 atm. %, while C is incorporated to an extent of only about 0.8 atm. % if the crystal has a Ge mole fraction of about 35 atm. %. That is to say, it is shown that the upper limit of the C mole fraction decreases as the Ge mole fraction increases. This is because Ge atoms and C atoms are incompatible with each other, i.e., excludes each other. If the data in FIG. 1 is extrapolated, the C mole fraction at which C is incorporated into crystal lattice sites is expected to be approximately 0 atm. % at a Ge mole fraction exceeding about 50 atm. %. In other words, in performing a CVD process under conditions under which the results shown in FIG. 1 were obtained, if the Ge mole fractions exceeds 50 atm. %, it is impossible to mix C into the $Si_{1-x-y}Ge_xC_y$ crystal. It should be noted that the data shown in FIG. 1 was obtained under certain conditions, and C at a mole fraction not exceeding about 2.5 atm. % is mostly incorporated into lattice sites, depending on apparatus or conditions for the process.

DISCLOSURE OF INVENTION

An object of the present invention is to provide a semiconductor crystal film with high crystallinity serving as a SiGeC layer with a high mole fraction of C, a method for producing the film, a semiconductor device with the semiconductor crystal film, and a method for fabricating the device.

An inventive semiconductor crystal film is composed of a multi-layer film that is formed by alternately stacking, a plurality of times, a set of semiconductor layers each mutually differing from every other in composition and that serves as a single SiGeC layer. The set of semiconductor layers include at least: a $Si_{1-x1-y1}Ge_{x1}C_{y1}$ layer ($0 \leq x1 < 1$ and $0 < y1 \leq 1$); and a $Si_{1-x2-y2}Ge_{x2}C_{y2}$ layer ($0 < x2 \leq 1$ and $0 \leq y2 < 1$), wherein $x1 < x2$, $y1 > y2$, and $x1$ and $y2$ are not simultaneously 0.

In the inventive film, if a mole fraction of Ge is high, a higher mole fraction of C can be incorporated into lattice sites than that in a single-layer SiGeC layer. Accordingly, strain caused by adding C is controllable, so that a multi-layer film serving as a SiGeC layer having a high Ge mole fraction can be attained. That is to say, it is possible to fabricate semiconductor devices such as high-performance transistors utilizing a wide bandgap between the Si layer and the multi-layer film.

Each of the semiconductor layers in the multi-layer film may be thinner than the thickness at which discrete quantum levels arise in the layer. Then, the multi-layer film obtains a function as a single SiGeC layer easily.

If the $Si_{1-x1-y1}Ge_{x1}C_{y1}$ layer is a SiGeC layer, the $Si_{1-x2-y2}Ge_{x2}C_{y2}$ layer may be a SiGe layer or a SiGeC layer.

If the $Si_{1-x1-y1}Ge_{x1}C_{y1}$ layer is a SiC layer, the $Si_{1-x2-y2}Ge_{x2}C_{y2}$ layer is a SiGeC layer.

The multi-layer film may contain more C than the upper limit of the C mole fraction given by the Ge mole fraction as determined by device/process conditions in the single-layer SiGeC layer.

It is preferable that each of the $Si_{1-x1-y1}Ge_{x1}C_{y1}$ layer and the $Si_{1-x2-y2}Ge_{x2}C_{y2}$ layer has a thickness of 3 nm or less.

It is more preferable that each of the $Si_{1-x1-y1}Ge_{x1}C_{y1}$ layer and the $Si_{1-x2-y2}Ge_{x2}C_{y2}$ layer has a thickness of 1.5 nm or less.

The multi-layer film may serve as a SiGeC layer having a Ge mole fraction of 30 atm. % or higher and a C mole fraction of 1.2 atm. % or higher.

An inventive semiconductor device includes: an underlying semiconductor layer containing at least Si; and a multi-layer film that is formed on the underlying semiconductor layer by alternately stacking, a plurality of times, a set of semiconductor layers each mutually differing from every other in composition and that serves as a single SiGeC layer. The multi-layer film includes at least: a $Si_{1-x1-y1}Ge_{x1}C_{y1}$ layer ($0 \leq x1 < 1$ and $0 < y1 \leq 1$); and a $Si_{1-x2-y2}Ge_{x2}C_{y2}$ layer ($0 < x2 \leq 1$ and $0 \leq y2 < 1$), wherein $x1 < x2$, $y1 > y2$, and $x1$ and $y2$ are not simultaneously 0.

In this device, if a mole fraction of Ge is high, a higher mole fraction of C can be incorporated into lattice sites than that in a single-layer SiGeC layer. Accordingly, strain caused by adding C is controllable, so that a multi-layer film serving as a SiGeC layer having a high Ge mole fraction can be attained. That is to say, it is possible to fabricate semiconductor devices such as high-performance transistors utilizing a wide bandgap between the Si layer and the multi-layer film.

Each of the semiconductor layers in the multi-layer film may be thinner than the thickness at which discrete quantum levels arise in the layer. Then, a semiconductor device that uses the multi-layer film having a function as a single SiGeC layer for its active region is obtained easily.

It is preferable that each of the $Si_{1-x1-y1}Ge_{x1}C_{y1}$ layer and the $Si_{1-x2-y2}Ge_{x2}C_{y2}$ layer has a thickness of 3 nm or less.

It is more preferable that each of the $Si_{1-x1-y1}Ge_{x1}C_{y1}$ layer and the $Si_{1-x2-y2}Ge_{x2}C_{y2}$ layer has a thickness of 1.5 nm or less.

The multi-layer film may serve as a SiGeC layer having a Ge mole fraction of 30 atm. % or higher and a C mole fraction of 1.2 atm. % or higher.

The inventive semiconductor device may be a MISFET in which the multi-layer film serves as a channel or a bipolar transistor in which the multi-layer film serves as a base layer.

An inventive method for producing a semiconductor crystal film composed of a multi-layer film that is formed by alternately stacking, a plurality of times, a set of semiconductor layers each mutually differing from every other in composition and that serves as a single SiGeC layer includes the steps of: a) epitaxially growing, on an underlying semiconductor layer, a semiconductor layer that is one of either a $Si_{1-x1-y1}Ge_{x1}C_{y1}$ layer ($0 \leq x1 < 1$ and $0 < y1 \leq 1$) or a $Si_{1-x2-y2}Ge_{x2}C_{y2}$ layer ($0 < x2 \leq 1$ and $0 \leq y2 < 1$), wherein x1<x2, y1>y2, and x1 and y2 are not simultaneously 0; and b) epitaxially growing, on the semiconductor layer grown by the step a), another semiconductor layer that is the other of either the $Si_{1-x1-y1}Ge_{x2}C_{y1}$ layer or the $Si_{1-x2-y2}Ge_{x2}C_{y2}$ layer. The steps a) and b) are repeated a plurality of times.

According to this method, a semiconductor crystal film that is a multi-layer film having the above-described function is easily produced.

In the steps a) and b), each of the semiconductor layers in the multi-layer film is preferably epitaxially grown to be thinner than the thickness at which discrete quantum levels arise in the layer.

In the steps a) and b), at least one of the semiconductor layers in the multi-layer film may be epitaxially grown to a thickness exceeding 1.5 nm,; and the method may further include the step of performing a heat treatment on the multi-layer film. Then, even if any of the semiconductor layers in the multi-layer film has a thickness at which discrete quantum levels arise during the deposition of the multi-layer film, the heat treatment allows the entire multi-layer film to serve as a single SiGeC layer.

In epitaxially growing the semiconductor layers containing Si, Ge and C during the steps a) and b), a disilane or monosilane gas, a germane gas and a monometylsilane gas are preferably decomposed by heat.

An inventive method for fabricating a semiconductor device including an underlying semiconductor layer containing at least Si and a multi-layer film that is formed on the underlying semiconductor layer by alternately stacking, a plurality of times, a set of semiconductor layers each mutually differing from every other in composition and that serves as a single SiGeC layer includes the steps of: a) epitaxially growing, on the underlying semiconductor layer, a semiconductor layer that is one of either a $Si_{1-x1-y1}Ge_{x1}C_{y1}$ layer ($0 \leq x1 < 1$ and $0 < y1 \leq 1$) or a $Si_{1-x2-y2}Ge_{x2}C_{y2}$ layer ($0 < x2 \leq 1$ and $0 \leq y2 < 1$), wherein x1<x2, y1>y2, and x1 and y2 are not simultaneously 0; and b) epitaxially growing, on the semiconductor layer grown by the step a), another semiconductor layer of the other of either the $Si_{1-x1-y1}Ge_{x1}C_{y1}$ layer or the $Si_{1-x2-y2}Ge_{x2}C_{y2}$ layer. The steps a) and b) are repeated a plurality of times.

According to this method, a semiconductor device having the semiconductor crystal film, which is the multi-layer film with the above-function, as an active region is easily fabricated.

In the steps a) and b), each of the semiconductor layers in the multi-layer films is preferably epitaxially grown to be thinner than the thickness at which discrete quantum levels arise in the layer In the steps a) and b), at least one of the semiconductor layers in the multi-layer film may be epitaxially grown to a thickness exceeding 1.5 nm; and the method may further includes the step of performing a heat treatment on the multi-layer film. Then, even if any of the semiconductor layers in the multi-layer film has a thickness at which discrete quantum levels arise during the deposition of the multi-layer film, the heat treatment allows the entire multi-layer film to serve as a single SiGeC layer.

In epitaxially growing the semiconductor layers containing Si, Ge and C during the steps a) and b), a disilane or monosilane gas, a germane gas and a monometylsilane gas are preferably decomposed by heat.

BEST MODE FOR CARRYING OUT THE INVENTION

Embodiment 1

Figure 2:
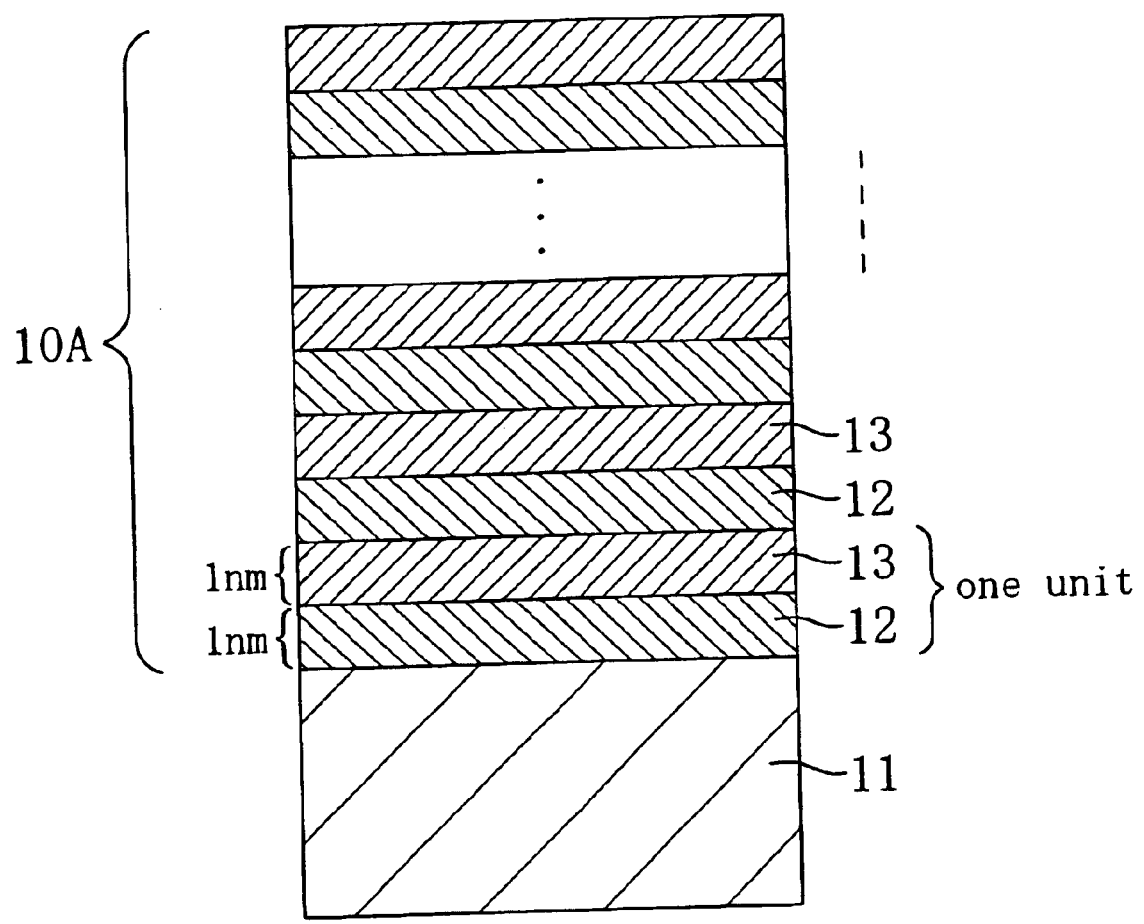
FIG. 2 is a cross-sectional view schematically showing a structure of a multi-layer film (a semiconductor crystal film) according to a first embodiment of the present invention.

FIG. 2 is a cross-sectional view schematically showing a structure of a multi-layer film (a semiconductor crystal film) according to a first embodiment of the present invention. In this embodiment, a $Si_{0.2}Ge_{0.8}$ layer 12 with a thickness of about 1 nm having a larger lattice constant than Si crystal and a $Si_{0.785}Ge_{0.2}C_{0.015}$ layer 13 with a thickness of about 1 nm are alternately deposited on a Si substrate 11 a plurality of times (50 cycles in this embodiment), thereby forming a multi-layer film 10A serving as a SiGeC layer with a thickness of about 100 nm. The multi-layer film 10A of this embodiment is considered to have a superlattice structure with little discrete quantum levels. Hereinafter, it will be described how the multi-layer film 10A is formed. FIGS. 3(a) through 3(e) are cross-sectional views showing respective process steps for producing a semiconductor crystal film according to the first embodiment.

In this embodiment, the $Si_{0.2}Ge_{0.8}$ layer 12 and the $Si_{0.785}Ge_{0.2}C_{0.015}$ layer 13 are deposited by an UHV-CVD process. For epitaxially growing a crystal on a substrate by an UHV-CVD process, pretreatment of the substrate is very important in general. Thus, the pretreatment of the Si substrate 11 will be initially described.

Figure 3A:
FIGS. 3(a) through 3(e) are cross-sectional views showing respective process steps for producing a semiconductor crystal film according to the first embodiment.

First, in a process step shown in FIG. 3(a), a pre-cleaned Si substrate 11 is prepared. In the pretreatment of the Si substrate 11, the Si substrate 11 is cleaned with a mixed solution of sulfuric acid—hydrogen peroxide aqueous solution, to remove organic materials and metal contaminations on the surface of the Si substrate 11. Then, the Si substrate 11 is cleaned with an ammonia—hydrogen peroxide aqueous solution, to remove attachments on the surface of the Si substrate 11. Subsequently, a natural oxide film on the surface of the Si substrate 11 is removed by cleaning with hydrofluoric acid solution. At this time, foreign matter as well as an oxide film of the natural oxide film is removed from the surface of the Si substrate 11.

Figure 3B:
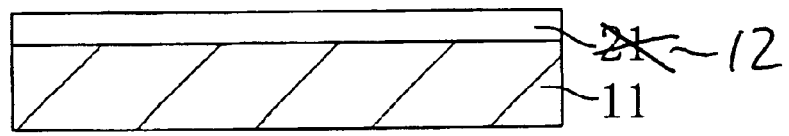

Next, in a process step shown in FIG. 3(b), the Si substrate 11 is immersed in the solution of ammonia—hydrogen peroxide aqueous solution, to form a thin protection oxide film 21 on the surface of the Si substrate 11. The protection oxide film 21, which has a relatively uniform thickness and covers the Si substrate 11, has a function of preventing foreign matter except for the oxide film from attaching to Si atoms in the Si substrate 11. Accordingly, the protection oxide film 21 allows exposure of the cleaned surface of the Si substrate 11 to go smoothly before the epitaxial growth starts.

Figure 3C:
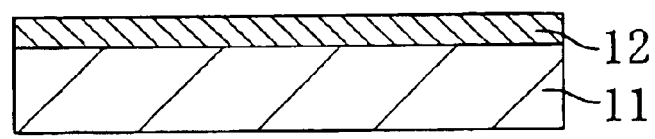

Then, in a process step shown in FIG. 3(c), the pretreated Si substrate 11 is introduced into a chamber (not shown) in crystal growth apparatus. The chamber is one evacuated to about $2\times10^{-9}$ Torr ($\approx2.7\times10^{-7}$ Pa) and the Si substrate 11 is heated to a temperature of 850° C. in a hydrogen gas atmosphere. As a result, the protection oxide film formed on the surface of the Si substrate 11 is removed, to expose the cleaned surface of the Si substrate 11.

Subsequently, the temperature of the Si substrate 11 is decreased to about 490° C. and source gases are introduced into the chamber, to permit crystal growth. In this embodiment, firstly, the $Si_{0.2}Ge_{0.8}$ layer 12, whose composition permits enough growth by a known process, is epitaxially grown on the Si substrate 11. During this epitaxial growth, flow rates of the gases are adjusted such that the partial pressures of $Si_2H_6$ and $GeH_4$ gases are about $7\times1^{-5}$ Torr ($\approx9.3\times10^{-3}$ Pa) and $2.8\times10^{-3}$ Torr ($\approx0.37$ Pa), respectively, in the chamber. This process is performed for about 5 sec., thereby forming the $Si_{0.2}Ge_{0.8}$ layer 12 with a thickness of 1 nm.

Figure 3D:
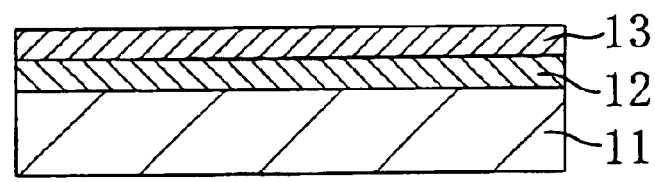

In a process step shown in FIG. 3(d), the $Si_{0.785}Ge_{0.2}C_{0.015}$ layer 13, whose composition permits enough growth by a known process, is then epitaxially grown on the $Si_{0.2}Ge_{0.8}$ layer 12. During this epitaxial growth, flow rates of the source gases are adjusted such that the partial pressures of $Si_2H_6$, $GeH_4$ and $SiH_3CH_3$ gases are about $7\times10^{-5}$ Torr ($\approx9.3\times10^{-3}$ Pa), about $1.7\times10^{-4}$ Torr ($\approx2.7$ Pa) and about $1.3\times10^{-5}$ Torr ($\approx1.7\times10^{-2}$ Pa), respectively, in the chamber. This process is performed for about 17 sec., thereby forming the $Si_{0.785}Ge_{0.2}C_{0.015}$ layer 13 with a thickness of 1 nm.

Figure 3E:
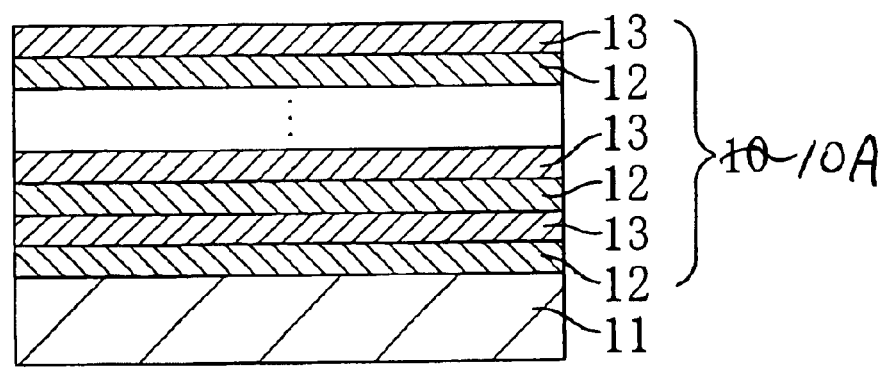

Then, in a process step shown in FIG. 3(e), the epitaxial growths of the $Si_{0.2}Ge_{0.8}$ and $Si_{0.785}Ge_{0.2}C_{0.015}$ layers 12 and 13 are alternately repeated under the same conditions as those shown in FIGS. 3(c) and 3(d), thereby forming a multi-layer film 10A with a superlattice structure in which the $Si_{0.2}Ge_{0.8}/Si_{0.785}Ge_{0.2}C_{0.015}$ stacked structure constitutes a unit. In this embodiment, the multi-layer film 10A has, for example, 50 units of the $Si_{0.2}Ge_{0.8}/Si_{0.785}Ge_{0.2}C_{0.015}$ stacked structures.

Such stacked structures result in the following advantage. According to "Semiconductor and Semimetals Vol. 24" (ACADEMIC PRESS, INC. p. 29 Volume Editor RAYMOND DINGLE), a past literature concerning superlattice structures, if each thickness of layers constituting a superlattice structure is 1.5 nm or less, a discrete quantum levels disappear in the superlattice structure so that the layers act as one crystal. Accordingly, if each thickness of the $Si_{0.2}Ge_{0.8}$ and $Si_{0.785}Ge_{0.2}C_{0.015}$ layers 12 and 1 nm as in this embodiment, the resultant multi-layer film 10A serves as a $Si_{0.4925}Ge_{0.5}C_{0.0075}$ layer. In other words, the multi-layer film 10A has a composition of $Si_{0.4925}Ge_{0.5}C_{0.0075}$ that is an average taken from respective mole fractions of Si, Ge and C in the $Si_{0.2}Ge_{0.8}$ and $Si_{0.785}Ge_{0.2}C_{0.015}$ layers 12 and 13.

Figure 1:
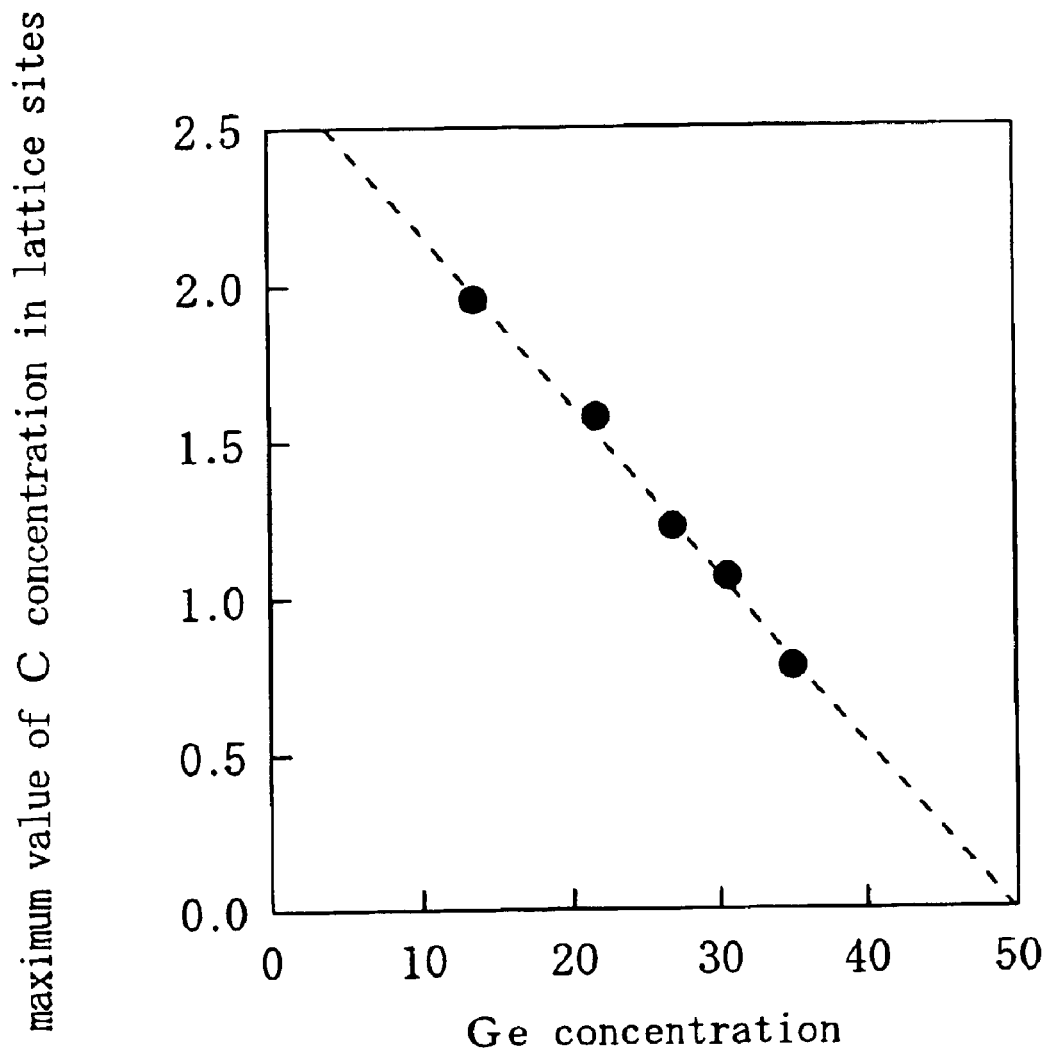
FIG. 1 is a graph showing how the maximum value (the upper limit) of a C mole fraction at which C is incorporated into lattice sites in a single-layer SiGeC crystal depends on a Ge mole fraction.

Thus, the multi-layer film 10A of this embodiment has a Ge mole fraction of 50 atm. %, i.e., more than 35 atm. % that is the limit shown in FIG. 1. As described above, in a single SiGeC layer, C is hardly incorporated into lattice sites in the SiGeC crystal containing about 50 atm. % of Ge. On the other hand, according to the present invention, it is possible to produce a crystal containing about 0.75 atm. % of C with a Ge mole fraction of 50 atm. %.

Next, a concept of the present invention will be described. As shown in FIG. 1, as to the dependency of the upper limit of a C mole fraction allows a single crystal to be produced on a Ge mole fraction, this upper limit has a marked tendency to decrease as the Ge content increases. In view of this, according to the present invention, SiGe layers having a composition whose Ge content is relatively small and SiGe layers having a relatively high Ge mole fraction are stacked such that as much C as possible is contained into the SiGe layers with a relatively small Ge mole fraction, while as little C as possible or none at all is contained into the SiGe layers with a relatively high Ge mole fraction. As a result, it is possible to produce a multi-layer film (a semiconductor crystal film) with a composition range that is difficult to produce with a single-layer $Si_{1-x-y}Ge_xC_y$ crystal.

However, the thickness ratio of the $Si_{0.2}Ge_{0.8}$ layer 12 to the $Si_{0.785}Ge_{0.2}C_{0.015}$ layer 13 is not limited to 1:1 but may be an arbitrary ratio.

Figure 4:
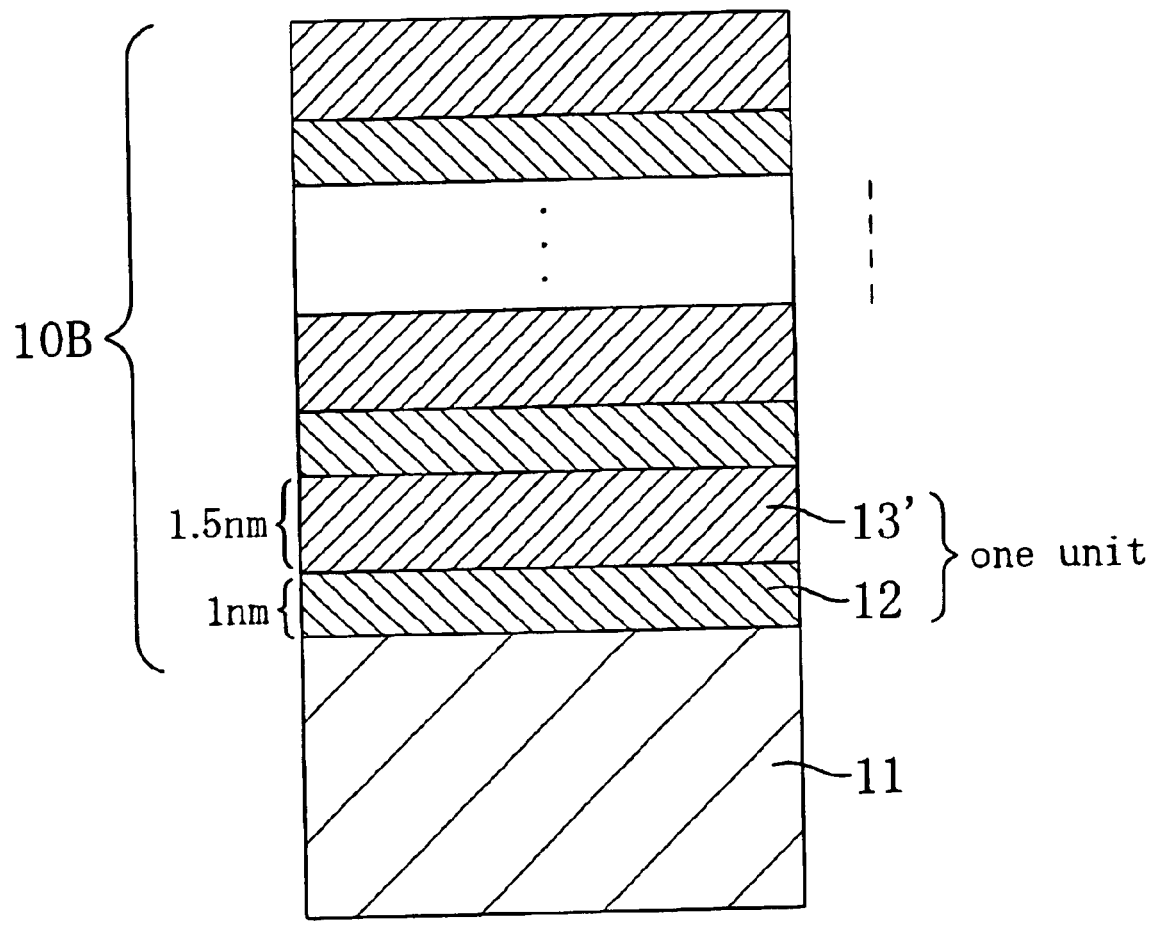
FIG. 4 is a cross-sectional view schematically showing a structure of a multi-layer film according to a modified example of the first embodiment.

FIG. 4 is a cross-sectional view schematically showing a structure of a multi-layer film according to a modified example of the first embodiment. In this modified example, the $Si_{0.2}Ge_{0.8}$ layer 12 with a thickness of about 1 nm and the $Si_{0.785}Ge_{0.2}C_{0.015}$ layer 13 with a thickness of about 1.5 nm are alternately deposited on the Si substrate 11 a plurality of times (40 cycles in this modified example), thereby forming a multi-layer film 10B (a semiconductor crystal film) serving as a SiGeC layer with a thickness of about 100 nm. Process steps for forming the multi-layer film 10B of this modified example are basically the same as in the first embodiment, and thus the description thereof will be omitted herein.

Figure 5:
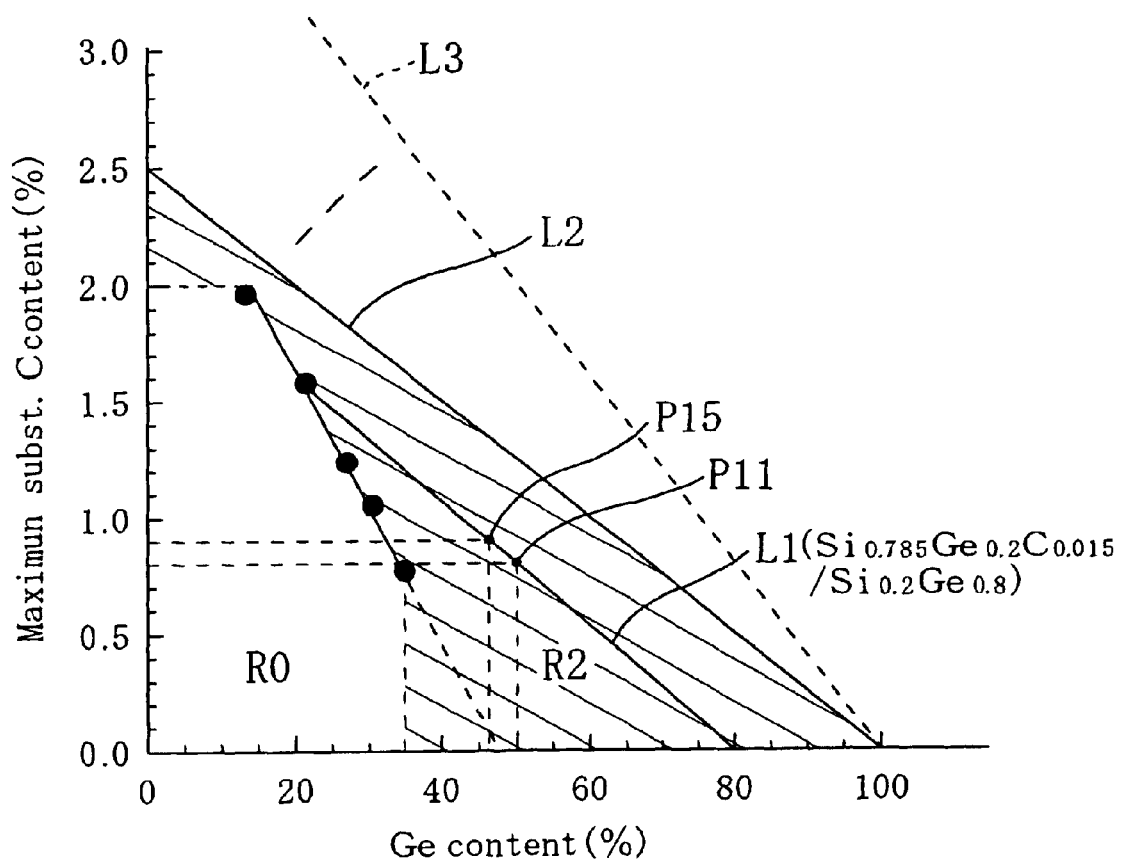
FIG. 5 is a diagram showing a composition range in which a single crystal can be produced using a known single SiGeC layer and a composition range for a multi-layer film serving as a SiGeC layer that can be produced according to the present invention.

FIG. 5 is a diagram showing a composition range in which a single crystal can be produced with a known single-layer SiGeC layer and a composition range for a multi-layer film serving as a SiGeC layer that can be produced according to the present invention. As shown in FIG. 5, the alternate deposition of the $Si_{0.2}Ge_{0.8}$ and $Si_{0.785}Ge_{0.2}C_{0.015}$ layers 12 and 13 results in a multi-layer film serving as a SiGeC layer whose compositional percentages are indicated by any one point corresponding to the ratio of the thickness of the $Si_{0.2}Ge_{0.8}$ layer 12 to that of the $Si_{0.785}Ge_{0.2}C_{0.015}$ layer 13 on the line L1. For example, if the thickness ratio of the $Si_{0.2}Ge_{0.8}$ layer 12 to the $Si_{0.785}Ge_{0.2}C_{0.015}$ layer 13 is 1:1.5, the resultant multi-layer film 10B (of the modified example of the first embodiment) serves as a SiGeC layer with a composition on the point P15 shown in FIG. 5.

If a $Si_{1-x1-y1}Ge_{x1}C_{y1}$ layer (where $0 \leq x1 < 1$ and $0 < y1 < 1$) with an extremely small Ge mole fraction, e.g., a $Si_{0.965}Ge_{0.01}C_{0.025}$ layer, and a $Si_{1-x2-y2}Ge_{x2}C_{y2}$ layer (where $0 < x2 \leq 1$ and $0 \leq y2 < 1$) with a composition close to that of a Ge layer, e.g., a $Si_{0.01}Ge_{0.99}$ layer, are alternately stacked (in which x1<x2, y1>y2 and x1 and y1 are not simultaneously 0), the resultant multi-layer film serves as a SiGeC layer with a composition indicated by a point on the line L2 shown in FIG. 5, corresponding to the thickness ratio between these layers. That is to say, the range in which the multi-layer film serves as a SiGeC layer with C atoms incorporated into lattice sites extends to the region R2 shown in FIG. 5. It should be noted that the upper limit of the C mole fraction with C atoms incorporated into lattice sites in a single-layer SiGeC or SiC layer is more than the upper limit shown in FIG. 1 as described above and is about 2.5 atm. %. On the other hand, as for the $Si_{0.965}Ge_{0.01}C_{0.025}$ layer with a thickness of 1.5 nm or less, C atoms can be incorporated into lattice sites even if the C mole fraction is higher than 2.5 atm. %. Therefore, the present invention makes it possible to produce a multi-layer film serving as a SiGeC layer with a C mole fraction exceeding 2.5 atm. %, as indicated by the broken line L3 shown in FIG. 5.

If a $Si_{1-x1-y1}Ge_{x1}C_{y1}$ layer (where $0 \leq x1 < 1$ and $0 < y1 \leq 1$) and a $Si_{1-x2-y2}Ge_{x2}C_{y2}$ layer (where $0 < x2 \leq 1$ and $0 \leq y2 < 1$) are alternately stacked (in which x1<x2, y1>y2 and x1 and y1 are not simultaneously 0), any of the layers may be the lowermost layer, and any of the layers may be the uppermost layer.

It is possible to produce a multi-layer film serving as a SiGeC layer by stacking $Si_{1-y}C_y$ (hereinafter also referred to as SiC) and SiGe layers. However, in depositing these two types of layers having mutually different compositions, if one type of layers is always a SiGeC layer as in the present invention, the following advantages are obtained. That is to say, in the multi-layer film made up of the SiC and SiGe layers, crystal layers whose lattice constants are greatly different from each other are alternately stacked, so that defects are easily created. Specifically, the SiC layer has a smaller lattice constant than Si, so that tensile strain is created in the SiC layer that is epitaxially grown on Si. On the other hand, the SiGe layer has a larger lattice constant than Si, so that compressive strain is created in the SiGe layer that is epitaxially grown on the Si substrate. Moreover, a greater compressive strain is created in the SiGe layer epitaxially grown on the SiC layer than that created in the Si substrate. Accordingly, if two types of crystals subjected to strains in mutually different directions, i.e., tensile and compressive strains, are alternately deposited, there arises a state in which defects occurs easily.

In contrast, if a SiGeC layer is used for at least one type of the layers as in the present invention, compressive or tensile strain can be relaxed, thus obtaining a multi-layer film (a semiconductor crystal film) having little defects.

In addition, SiC layers are grown slowly, while SiGeC layers can be grown faster than the SiC layers. Thus, in view of practical mass production, a combination of SiGeC and SiGe layers or a combination of SiGeC layers is preferable for stacking two types of semiconductor layers.

Embodiment 2

In the first embodiment, the inventive multi-layer film, which is obtained by alternate epitaxial growths of two crystal films having two mutually different compositions, and the method for producing the film have been described. In this embodiment, another inventive multi-layer film that is obtained by alternate epitaxial growths of three crystal layers having mutually different compositions will be described.

Figure 6:
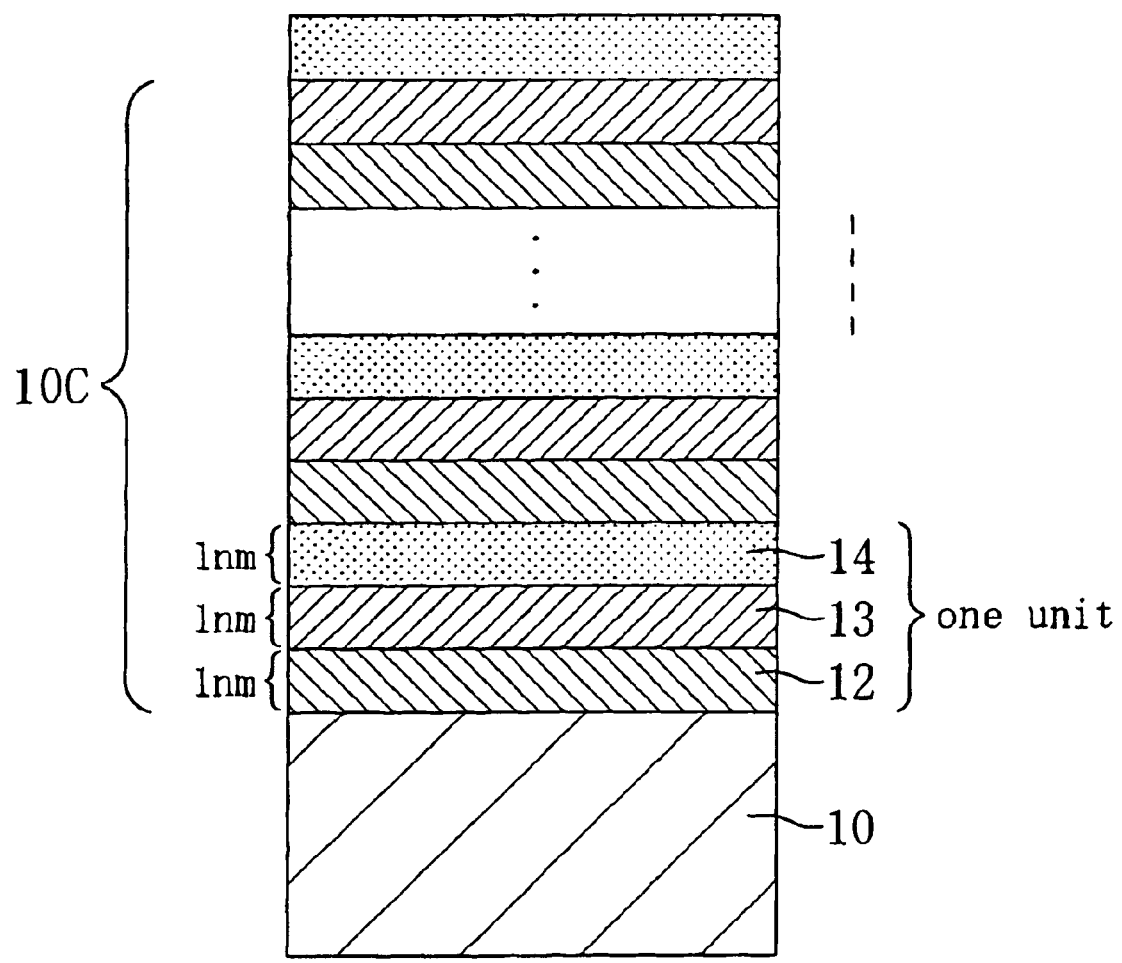
FIG. 6 is a cross-sectional view schematically showing a structure of a multi-layer film according to a second embodiment of the present invention.

FIG. 6 is a cross-sectional view schematically showing a structure of a multi-layer film (a semiconductor crystal film) according to a second embodiment of the present invention. In this embodiment, a $Si_{0.2}Ge_{0.8}$ layer 12 with a thickness of about 1 nm having a larger lattice constant than Si crystal and a $Si_{0.785}Ge_{0.2}C_{0.015}$ layer 13 with a thickness of about 1 nm, and a $Si_{0.832}Ge_{0.15}C_{0.018}$ layer 14 with a thickness of about 1 nm are alternately deposited on a Si substrate 11 a plurality of times (33 cycles in this embodiment), thereby forming a multi-layer film 10C (a semiconductor crystal film) serving as a SiGeC layer with a thickness of about 99 nm. The multi-layer film 10C of this embodiment is also considered to have a superlattice structure with little discrete quantum levels. Hereinafter, it will be described how the multi-layer film 10C is formed. Process steps for producing the multi-layer film of this embodiment are basically the same as in the first embodiment, and thus the description thereof will be omitted herein.

In this embodiment, pretreatment of the Si substrate 11 is performed through the same process steps as in the first embodiment. Then, the temperature of the Si substrate 11 is decreased to about 490° C. and source gases are introduced into the chamber, to permit crystal growth. First, as in the first embodiment, a $Si_{0.2}Ge_{0.8}$ layer 12 with a thickness of about 1 nm and a $Si_{0.785}Ge_{0.2}C_{0.015}$ layer 13 with a thickness of about 1 nm are epitaxially grown as in the first embodiment.

Next, a $Si_{0.832}Ge_{0.15}C_{0.018}$ layer 14, whose composition permits enough growth by a known process, is epitaxially grown on $Si_{0.785}Ge_{0.2}C_{0.015}$ layer 13. During this epitaxial growth, flow rates of the source gases are adjusted such that the partial pressures of $Si_2H_6$, $GeH_4$, and $SiH_3CH_3$ gases are about $7 \times 10^{-5}$ Torr ($\approx 9.3 \times 10^{-3}$ Pa), $8.3 \times 10^{-5}$ Torr ($\approx 1.1 \times 10^{-4}$ Pa), and abut $1.8 \times 10^{-5}$ Torr ($\approx 2.4 \times 10^{-2}$ Pa), respectively, in the chamber. This process is performed for about 35 sec., thereby forming the $Si_{0.832}Ge_{0.15}C_{0.018}$ layer 14 with a thickness of 1 nm.

Thereafter, epitaxial growths of the $Si_{0.2}Ge_{0.8}$ and $Si_{0.785}Ge_{0.2}C_{0.015}$ and $Si_{0.832}Ge_{0.15}C_{0.018}$ layers 12, 13 and 14 are alternately repeated under the same conditions as described above, thereby forming the multi-layer film 10C with a superlattice structure in which the $Si_{0.2}Ge_{0.8}/Si_{0.785}Ge_{0.2}C_{0.015}/Si_{0.832}Ge_{0.15}C_{0.018}$ stacked structure constitutes a unit. In this embodiment, the multi-layer film 10C has, for example, 33 units of the $Si_{0.2}Ge_{0.8}/Si_{0.785}Ge_{0.2}C_{0.0015}/Si_{0.832}Ge_{0.15}C_{0.018}$ stacked structures.

According to this embodiment, the multi-layer film 10C serving as a $Si_{0.606}Ge_{0.383}C_{0.011}$ layer with a thickness of 99 nm is obtained. That is to say, as shown in FIG. 5, only 0.6 atm. % of C atoms are incorporated into lattice sites with a Ge mole fraction of about 38 atm. % in a single-layer SiGeC layer. On the other hand, since three types of crystal layers are combined in this embodiment, the resultant multi-layer film 10C (semiconductor crystal film) serves as a SiGeC layer containing about 1.1 atm. % of C atoms incorporated into lattice sites.

In the foregoing embodiments, as crystal layers constituting a unit of a superlattice structure, the two or three types of crystal layers with mutually different compositions are formed. However, the inventive multi-layer film is not limited to these embodiments. That is to say, the inventive multi-layer film is also obtained by alternately stacking more than three types of crystal layers. It should be noted that in that case, two of the three or more types of crystal layers need to be a $Si_{1-x1-y1}Ge_{x1}C_{y1}$ layer (where $0 \leq x1 < 1$ and $0 < y1 < 1$), a $Si_{1-x2-y2}Ge_{x2}C_{y2}$ layer (where $0 < x2 \leq 1$ and $0 \leq y2 < 1$, $x1 < x2$ and $y1 > y2$), and a $Si_{1-x1-y1}Ge_{x1}C_{y1}$ layer (where $0 \leq x1 < 1$ and $0 < y1 < 1$).

In a case where three or more types of crystal layers are stacked to form a multi-layer film serving as a SiGeC layer, the deposition order of the crystal layers is not limited and the same advantageous effects are attained irrespective of the deposition order.

In addition, although not disclosed, a Si buffer layer may be epitaxially grown between the multi-layer film 10A, 10B or 10C and the Si substrate 11, and a Si cap layer may be deposited over the multi-layer film 10A, 10B or 10C, in any of the embodiments.

Embodiment 3

Next, an example of a hetero bipolar transistor with the multi-layer film 10A, 10B or 10C serving as a SiGeC film described in the foregoing embodiments.

Figure 7:
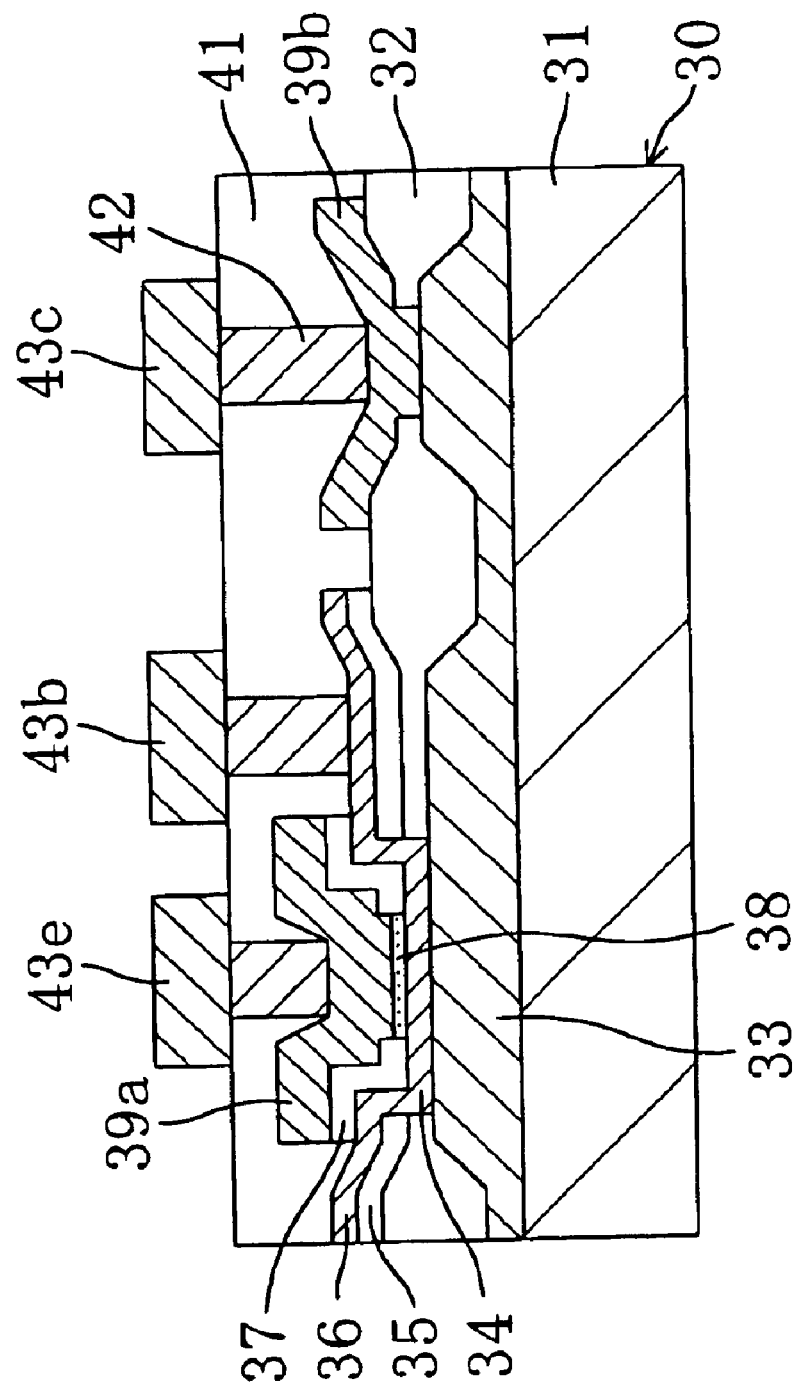
FIG. 7 is a cross-sectional view schematically showing a structure of an npn heterojunction bipolar transistor (HBT) according to a third embodiment of the present invention.

FIG. 7 is a cross-sectional view schematically showing a structure of an npn heterojunction bipolar transistor (HBT) according to this embodiment. As shown in FIG. 7, the HBT of this embodiment includes an $n^{30}$ layer 31, which is defined in a Si substrate 30 and contains an n-type dopant (e.g., phosphorus) at a high-concentration; a collector layer 33, which is epitaxially grown on the n layer 31 and contains an n-type dopant (e.g., phosphorus) at a low-concentration; and isolation layer 32 of a thermal oxide film, which defines the collector layer 33; a first deposited oxide film 35 formed on the isolation layer 32; a multi-layer film 36, which fills in an opening (an opening for base) formed in the isolation layer 32 and the first deposited oxide film 35 to extend over the first deposited oxide film 35 and which serves as an SiGeC layer; a second deposited oxide film 37 farmed on the multi-player film 36; an emitter layer 38 of a Si film, which is epitaxially grown on the multi-layer film 36 in an opening (an opening for emitter) formed in the second deposited oxide film 37; and emitter lead-electrode 39a, which is made of a polysilicon film and formed on the emitter layer 38 to fill in the opening (the opening for emitter) formed in the second deposited oxide film 37; a collector lead-electrode 39bthat is formed on a region of the collector layer 33 (a lead-layer for collector) separated by the isolation layer 32 and that is made of the polysilicon film which the emitter lead-electrode 39ais made of; and interlevel dielectric film 41 of a silicon oxide film formed on the substrate; plugs 42 in contact with the emitter lead-electrode 39a, the multi-layer film 36 and the collector lead-electrode 39b, respectively, through the interlevel dielectric film 41; and emitter, base and collector electrodes 43e, 43band 43cformed on the interlevel dielectric film 41 and connected to the emitter lead-electrode 39a, the multi-layer film 36 and the collector lead-electrode 39b, respectively.

Figure 8:
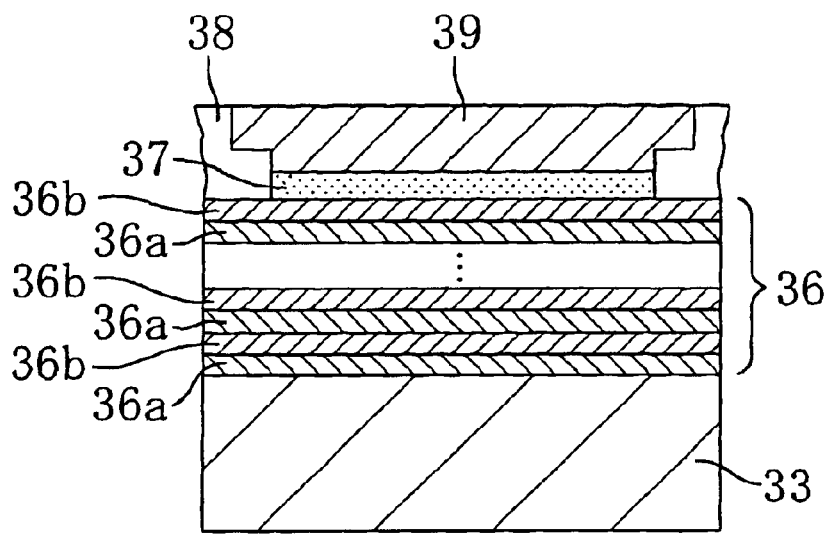
FIG. 8 is a cross-sectional view showing a structure of the emitter-base-collector junction shown in FIG. 7 under magnification.

FIG. 8 is a cross-sectional view showing a structure of the emitter-base-collector junction shown in FIG. 7 under magnification. As shown in FIG. 8, the multi-layer film 36, which has been formed on the collector layer 33 of a Si layer and serves as a SiGeC layer, is formed by alternately stacking the $Si_{0.2}Ge_{0.8}$ layer 36a with a thickness of about 1 nm and a $Si_{0.785}Ge_{0.2}C_{0.015}$ layer 36b with a thickness of about 1 nm a plurality of times (25 cycles in this embodiment), thus obtaining a total thickness of about 50 nm. That is to say, the resultant multi-layer film 36 serves as a $Si_{0.4925}Ge_{0.5}C_{0.0075}$ layer. In addition, the multi-layer film 36 contains boron (B), which is a p-type dopant, and serves as a base layer. The emitter layer 38 formed on the multi-layer film 36 contains arsenic (As), which is an n-type dopant.

During the process step of forming the multi-layer film 36 in the fabrication process of the HBT according to this embodiment, diborane ($B_2H_6$) is added in each of the epitaxial growths of the $Si_{0.2}Ge_{0.8}$ and $Si_{0.785}Ge_{0.2}C_{0.015}$ layers 36a and 36b performed by the process steps described in the first embodiment. Other process steps can be performed by known techniques, and thus the description thereof will be omitted.

In the HBT of this embodiment, the multi-layer film 36, functioning as base, serves as a $Si_{0.4925}Ge_{0.5}C_{0.0075}$ layer having as high as about 50 atm. % of Ge mole fraction. As a result, high heterobarriers are formed at the valence and conduction band edges in the junction between the base and emitter layers.

Figure 9:
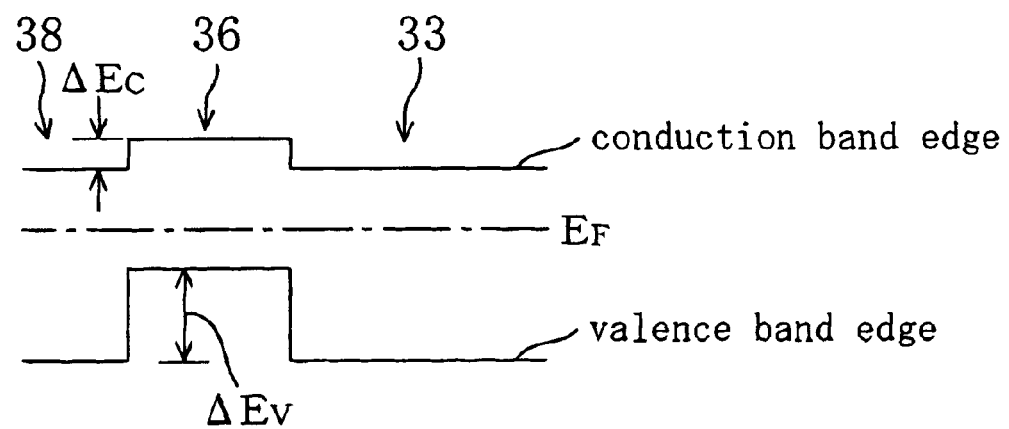
FIG. 9 is an energy band diagram schematically illustrating a band structure in cross-section through an emitter layer, a base layer and a collector layer when no bias is applied.

FIG. 9 is an energy band diagram schematically illustrating a band structure in cross-section through the emitter layer 38, the multi-layer film 36 serving as a base layer and the collector layer 33 when no bias is applied. As shown in FIG. 9, the multi-layer film 36 serves as a SiGeC layer having a high Ge mole fraction, thus ensuring wide band offset between the multi-layer film 36 and each of the emitter layer 38 and the collector layer, which are made of Si layers and respectively located on and under the multi-layer film 36. In addition, at the junction between the emitter layer 38 containing the n-type dopant and the base layer (the multi-layer film 36) containing the p-type dopant, the band offset $\Delta Ec$ at the conduction band edge can be set small and the band offset $\Delta Ev$ at the valence band edge can be set high. That is to say, even if a low bias is applied between the emitter and base, it is possible to obtain current caused by a sufficiently large amount of electrons and to reduce current caused by holes inversely flowing, i.e., from the base to the emitter, thus achieving a HBT which has a high current gain and operates at low voltages. A simulation performed by the present inventors shows that HBTs using the inventive multi-layer film as its base can operate at a low voltage of about 0.45 V.

From this voltage value, it is found that a great effect of decreasing the voltage at which bipolar transistors can operate is achieved in the HBTs, considering that bipolar transistors with Si base layers operate at a voltage of about 0.7 V, In the inventive HBT, the multi-layer film 36 serving as a base layer contains about 0.75 atm. % of C, so that strain created in the multi-layer film 36 serving as a base layer is reduced as a whole. As a result, crystal defects are less created during heat treatment in the process. On the other hand, in forming a single-layer SiGeC layer, if Ge mole fraction is about 50 atm. %, C is hardly incorporated into crystal sites. As a result, defects are likely to occur, thus deteriorating device characteristics.

Further, since C is contained in every part of the multi-layer film 36, boron (B) diffusion can be effectively suppressed, so that concentration profile of the dopant is easily maintained as intended even of the multi-layer film 36 as a base layer is thin. Decreasing the thickness of the multi-layer film as a base layer reduces the time taken in traveling through the base, thus achieving a device that can operate at high speed. In other words, if the inventive multi-layer film is used for HBTs, it is possible to fabricate high-speed transistors that can operate at low voltages with thin base.

Embodiment 4

Figure 10:
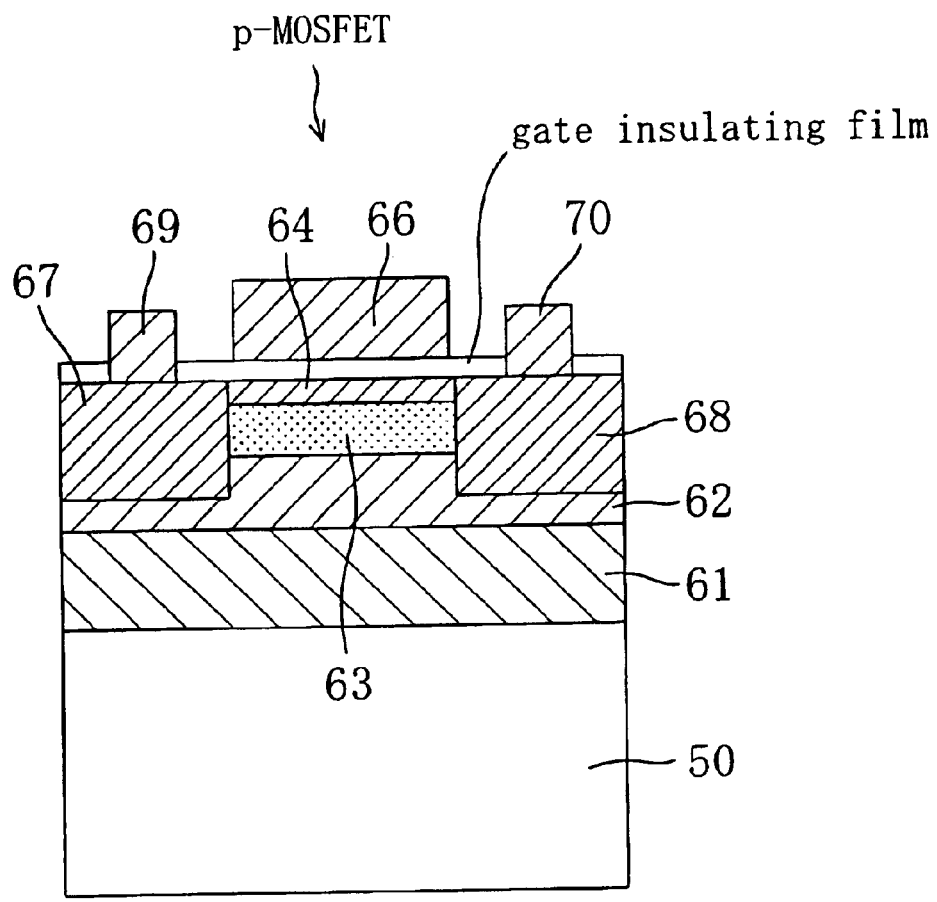
FIG. 10 is a cross-sectional view showing a structure of a heterojunction CMIS device (HCMIS device) utilizing a multi-layer film serving as a SiGeC layer for a p-channel, according to a fourth embodiment of the present invention.

FIG. 10 is a cross-sectional view showing a structure of a heterojunction MISFET (HMISFET) using a multi-layer film serving as a SiGeC layer for a p-channel, according to a fourth embodiment of the present invention.

As shown in FIG. 10, the HMISFET of this embodiment is provided above an n-well 61 formed on a Si substrate 50.

On the n-well 61, a silicon layer 62; a multi-layer film 63, formed by stacking, ten times, a $Si_{0.2}Ge_{0.8}$ layer with a thickness of 1 nm and a $Si_{0.785}Ge_{0.2}C_{0.015}$ layer with a thickness of 1 nm; and a silicon cap layer 64 are stacked in this order by an UHV-CVD process. The multi-layer film 63 is made of the film used for a multi-layer film 53 and serves as a $Si_{0.4925}Ge_{0.5}C_{0.0075}$ layer as a whole, to be a channel region through which holes flow. A gate insulating film made of a silicon oxide film formed by thermally oxidizing the silicon cap layer 64 is provided on the silicon cap layer 64. A gate electrode 66 is provided on the gate insulating film. Source/drain regions 67 and 68 of a $p^+$ layer are defined below either side of the gate electrode 66. Source/drain electrodes 69 and 70 are formed on the source/drain regions 67 and 68, respectively.

Figure 11:
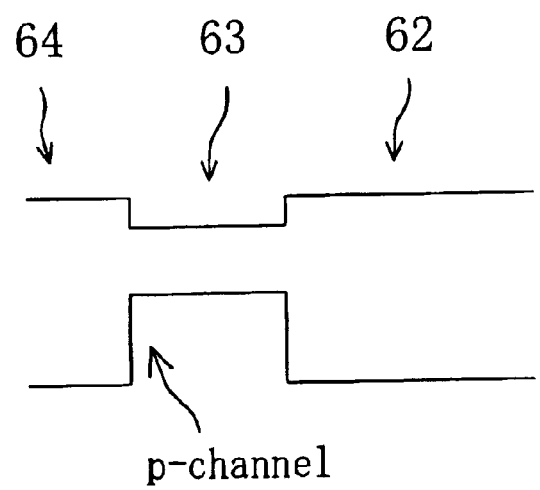
FIG. 11 is a diagram conceptually showing a band state in a structure where a silicon layer, the multi-layer film and a silicon layer are stacked in the HCMIS device of the fourth embodiment.

FIG. 11 is a diagram conceptually showing a band state in a structure where the silicon layer, multi-layer film and silicon layer are stacked in the HMISFET of this embodiment. In FIG. 11, the conductivity type of a dopant is not taken into account.

As shown in FIG. 11, since the multi-layer film serving as a SiGeC layer has a high Ge mole fraction in this embodiment, a high heterobarrier for confining carriers therein is formed at the valence band edge by utilizing wide bandgaps between the multi-layer film and each of the two silicon layers sandwiching the multi-layer film therebetween. Accordingly, a p-channel region exhibiting high efficiency in confining holes can be formed.

In addition, since the adjustable ranges of Ge and C mole fractions are extended to high degrees as described above, the ratio of the height of the heterobarrier formed at the conduction band edge to the height of the heterobarrier formed at the valence band edge can be adjusted to a desired value. Thus, by using, as an n-channel, a multi-layer film of a film used for a multi-layer film of a p-MISFET, it is possible to fabricate a CMIS device exhibiting high efficiency in confining both electrons and holes.

Other Embodiments

In the foregoing embodiments, each of the semiconductor layers ($Si_{1-x1-y1}Ge_{x1}C_{y1}$ and $Si_{1-x2-y2}Ge_{x2}C_{y2}$ layers) in the multi-layer film is thin (e.g., about 1.5 nm or less) such that discrete quantum levels do not exist in the layer. However, even if discrete quantum levels are generated in some degree, advantages of the present invention can be obtained so long as the multi-layer film serves as a SiGeC layer as a whole. In addition, if the boundary of the layers becomes unclear by performing heat treatment at about 900° C. after stacking the $Si_{1-x1-y1}Ge_{x1}C_{y1}$ and $Si_{1-x2-y2}Ge_{x2}C_{y2}$ layers each having a thickness of about 2 to 3 nm, for example, the whole of the multi-layer film serves as a SiGeC layer with ease.

In a HBT, it is possible to provide a base layer with a graded composition such that a bandgap becomes narrower from the emitter layer to the collector layer.

In the foregoing embodiments, applications of multi-layer films to the base layer of the HBT and to each channel region of the CMIS devices have been described. Further, the inventive multi-layer films are also applicable to other heterojunction devices such as resonant tunnel diodes (RTD).

According to the present invention, it is possible to provide a semiconductor crystal film, which is a multi-layer film serving as a SiGeC layer with a high Ge mole fraction and a high C mole fraction, a method for producing the layer, a semiconductor device and a method for fabricating the device.

Industrial Applicability

The inventive semiconductor crystal film used for channel regions of heterojunction bipolar transistors or CMIS devices can be incorporated in various kind of electric units such as information and communication units and computers.

What is claimed is:

1. A semiconductor crystal film comprising a multi-layer film that is formed by alternately stacking, a plurality of times, a set of semiconductor layers each mutually differing from every other in composition, and that serves as a single $Si_{1-A-B}Ge_AC_B$ layer (0<A<1 and 0<B<1), wherein said multi-layer film includes at least:
a $Si_{1-x1-y1}Ge_{x1}C_{y1}$ layer (0<x1<1 and 0<y1<1); and $Si_{1-x2-y2}Ge_{x2}C_{y2}$ layer (0<x2<1 and 0<y2<1)
wherein x1<x2, y1>y2, and x1 and y2 are not simultaneously 0.

2. The semiconductor crystal film of claim 1, wherein each of the semiconductor layers in the multi-layer film is thinner than the thickness at which discrete quantum levels arise in the layer.

3. The semiconductor crystal film of claim 1, wherein x1≠0.

4. The semiconductor crystal film of claim 1, wherein x1=0 and y2≠0.

5. The semiconductor crystal film of claim 1, wherein the multi-layer film contains more C than the upper limit of the C mole fraction given by the Ge mole fraction as determined by device/process conditions in the single-layer SiGeC layer.

6. The semiconductor crystal film of claim 1, wherein each of the $Si_{1-x1-y1}Ge_{x1}C_{y1}$ layer and the $Si_{1-x2-y2}Ge_{x2}C_{y2}$ layer has a thickness of 3 nm or less.

7. The semiconductor crystal film of claim 6, wherein each of the $Si_{1-x1-y1}Ge_{x1}C_{y1}$ layer and the $Si_{1-x2-y2}Ge_{x2}C_{y2}$ layer has a thickness of 1.5 nm or less.

8. The semiconductor crystal film of claim 1, wherein the multi-layer film serves as a SiGeC layer having a Ge mole fraction of 30 atm. % or higher and a C mole fraction of 1.2 atm. % or higher.

9. A semiconductor device comprising:
an underlying semiconductor layer containing at least Si; and
a multi-layer film that is formed on the underlying semiconductor layer by alternately stacking, a plurality of times, a set of semiconductor layers each mutually differing from every other in composition and that serves as a single $Si_{1-A-B}Ge_AC_B$ layer (0<A<1 and 0<B<1)
wherein the multi-layer film includes at least:
a $Si_{1-x1-y1}Ge_{x1}C_{y1}$ layer (0<x1<1 and 0<y1); and
a $Si_{1-x2-y2}Ge_{x2}C_{y2}$ layer (0<x2<1 and 0<y2<1), wherein x1<x2, y1<y2, and x1 and y2 are not simultaneously 0.

10. The semiconductor device of claim 9, wherein each of the semiconductor layers in the multi-layer film is thinner than the thickness at which discrete quantum levels arise in the layer.

11. The semiconductor device of claim 9, wherein each of the $Si_{1-x1-y1}Ge_{x1}C_{y1}$ layer and the $Si_{1-x2-y2}Ge_{x2}C_{y2}$ layer has a thickness of 3 nm or less.

12. The semiconductor device of claim 11, wherein each of the $Si_{1-x1-y1}Ge_{x1}C_{y1}$ layer and the $Si_{1-x2-y2}Ge_{x2}C_{y2}$ layer has a thickness of 1.5 nm or less.

13. The semiconductor device of claim 9, wherein the multi-layer film serves as a SiGeC layer having a Ge mole fraction of 30 atm. % or higher and a C mole fraction of 1.2 atm. % or higher.

14. The semiconductor device of claim 9, wherein the semiconductor device is a MISFET in which the multi-layer film serves as a channel.

15. The semiconductor device of claim 9, wherein the semiconductor device is a bipolar transistor in which the multi-layer film serves as a base layer.

16. A method for producing a semiconductor crystal film comprising a multi-layer film that is formed by alternately stacking, a plurality of times, a set of semiconductor layers each mutually differing from every other in composition and that serves as a single $Si_{1-A-B}Ge_{A}C_{B}$ layer ($0<A<1$ and $0<B<1$), the method comprising the steps of:

a) epitaxially growing, on an underlying semiconductor layer, a semiconductor layer that is one of either a $Si_{1-x1-y1}Ge_{x1}C_{y1}$ layer ($0 x1<1$ and $0 y1<1$) or a $Si_{1-x2-y2}Ge_{x2}C_{y2}$ layer ($0<x2<1$ and $0<y2<1$, wherein $x1<x2$, $y1<y2$, and $x1$ and $y2$ are not simultaneously 0; and b) epitaxially growing, on the semiconductor layer grown by said step a), another semiconductor layer that is the other of either the $Si_{1-x1-y1}Ge_{x1}C_{y1}$ layer or the $Si_{1-x2-y2}Ge_{x2}C_{y2}$ layer, wherein said steps a) and b) are repeated a plurality of times.

17. The method of claim 16, wherein in said steps a) and b), each of the semiconductor layers in the multi-layer film is epitaxially grown to be thinner than the thickness at which discrete quantum levels arise in the layer.

18. The method of claim 16, wherein:

in said steps a) and b), at least one of the semiconductor layers in the multi-layer film is epitaxially grown to a thickness exceeding 1.5 nm; and the method further includes the step of performing a heat treatment on the multi-layer film.

19. The method of claim 16, wherein in epitaxially growing the semiconductor layers containing Si, Ge and C during said steps a) and b), a disilane or monosilane gas, a germane gas and a monometylsilane gas are decomposed by heat.

20. A method for fabricating a semiconductor device, the semiconductor device including an underlying semiconductor layer containing at least Si and a multi-layer film that is formed on the underlying semiconductor layer by alternately stacking, a plurality of times, a set of semiconductor layers each mutually differing from every other in composition and that serves as a single $Si_{1-A-B}Ge_{A}C_{B}$ layer ($0_{A1\ and}\ 0<B<1$), the method comprising the steps of:

a) epitaxially growing, on the underlying semiconductor layer, a semiconductor layer that is one of either a $Si_{1-x1-y1}Ge_{x1}C_{y1}$ layer ($0<x1<1$ and $0<y1<1$) or a $Si_{1-x2-y2}Ge_{x2}C_{y2}$ layer ($0<x2<1$ and $0<y2<1$), wherein $x1<l_{x2}$, $y1<y2$, and $x1$ and $y2$ are not simultaneously 0; and b) epitaxially growing, on the semiconductor layer grown by said step a), another semiconductor layer of the other of either the $Si_{1-x1-y1}Ge_{x1}C_{y1}$ layer or the $Si_{1-x2-y2}Ge_{x2}C_{y2}$ layer, wherein said steps a) and b) are repeated a plurality of times.

21. The method of claim 20, wherein in said steps a) and b), each of the semiconductor layers in the multi-layer films is epitaxially grown to be thinner than the thickness at which discrete quantum levels arise in the layer.

22. The method of claim 20, wherein: in said steps a) and b), at least one of the semiconductor layers in the multi-layer film is epitaxially grown to a thickness exceeding 1.5 nm; and the method further includes the step of performing a heat treatment on the multi-layer film.

23. The method of claim 20, wherein in epitaxially growing the semiconductor layers containing Si, Ge and C during said steps a) and b), a disilane or monosilane gas, a germane gas and a monometylsilane gas are decomposed by heat.

* * * * *

UNITED STATES PATENT AND TRADEMARK OFFICE
CERTIFICATE OF CORRECTION

PATENT NO. : 6,852,602 B2
DATED : February 8, 2005
INVENTOR(S) : Yoshihiko Kanzawa et al.

It is certified that error appears in the above-identified patent and that said Letters Patent is hereby corrected as shown below:

Column 14,
Line 60, change "layer ($0<x1<1$ and $0<y1$)" to -- layer ($0\leq x1<1$ and $0<y1<1$) --
Line 62, change "$x1<x2, y1<y2$" to -- $x1<x2, y1>y2$ --;

Column 15,
Line 25, change "layer ($0x1<1$ and $0y1<1$)" to -- layer ($0\leq x1<1$ and $0<y1<1$) --
Line 27, change "$x1<x2, y1<y2$" to -- $x1<x2, y1>y2$ --;

Column 16,
Line 12, change "layer $0_{A1 \text{ and}} 0<B<1$)" to -- layer ($0<A<1$ and $0<B<1$) --;
Line 18, change "$x1<1_{x2}, y1<y2,$" to -- $x1<x2, y1>y2$ --.

Signed and Sealed this

Seventh Day of June, 2005

JON W. DUDAS
*Director of the United States Patent and Trademark Office*